United States Patent
Solal et al.

(10) Patent No.: US 10,924,086 B2
(45) Date of Patent: Feb. 16, 2021

(54) SURFACE ACOUSTIC WAVE (SAW) DEVICE WITH ANTIREFLECTIVE STRUCTURE

(71) Applicant: Qorvo US, Inc., Greensboro, NC (US)

(72) Inventors: Marc Solal, Longwood, FL (US); Charles E. Carpenter, Orlando, FL (US); Timothy Daniel, Orlando, FL (US); Shogo Inoue, Longwood, FL (US); Tom Moonlight, Altamonte Springs, FL (US)

(73) Assignee: Qorvo US, Inc., Greensboro, NC (US)

( * ) Notice: Subject to any disclaimer, the term of this patent is extended or adjusted under 35 U.S.C. 154(b) by 548 days.

(21) Appl. No.: 15/785,048

(22) Filed: Oct. 16, 2017

(65) Prior Publication Data

US 2018/0109242 A1 Apr. 19, 2018

Related U.S. Application Data

(60) Provisional application No. 62/408,395, filed on Oct. 14, 2016.

(51) Int. Cl.
*H03H 9/64* (2006.01)
*H03H 9/25* (2006.01)
(Continued)

(52) U.S. Cl.
CPC ........... *H03H 9/6489* (2013.01); *H01L 41/29* (2013.01); *H01L 41/337* (2013.01);
(Continued)

(58) Field of Classification Search
CPC ............. H03H 9/6498; H03H 9/02574; H03H 9/02669; H03H 9/02866; H03H 9/1085; H01L 41/29; H01L 41/337
(Continued)

(56) References Cited

U.S. PATENT DOCUMENTS 4,229,506 A * 10/1980 Nishiyama .............. H01L 41/18
204/192.18
7,382,081 B2 6/2008 Takano
(Continued)

OTHER PUBLICATIONS

Defranould, P., et al., "Design of a Two Dimensional Array for B and C Ultrasonic Imaging System," IEEE International Ultrasonics Symposium, Oct. 26-28, 1977, Phoenix, Arizona, USA, pp. 259-263.

(Continued)

*Primary Examiner* — Thomas M Dougherty
(74) *Attorney, Agent, or Firm* — Withrow & Terranova, P.L.L.C.

(57) ABSTRACT

A device including a piezoelectric substrate, an interdigital transducer (IDT), and an antireflective structure is disclosed herein. The piezoelectric substrate has a front-side surface and a smoothed back-side surface. The IDT is on the front-side surface of the piezoelectric substrate. The antireflective structure is over at least a portion of the smoothed back-side surface of the piezoelectric substrate. By having the antireflective structure on at least a portion of the smoothed back-side surface of the piezoelectric substrate, reflection of spurious bulk acoustic waves toward the front-side surface of the piezoelectric substrate can be reduced and/or eliminated to lessen interference with surface acoustic waves. The reduction and/or elimination of spurious bulk acoustic waves allows the device to forego conventional roughening of the back-side surface of the piezoelectric substrate, thereby reducing fractures at the back-side surface and allowing for singulation techniques capable of producing smaller die sizes.

39 Claims, 10 Drawing Sheets

(51) Int. Cl.
*H01L 41/29* (2013.01)
*H03H 9/02* (2006.01)
*H03H 9/10* (2006.01)
*H01L 41/337* (2013.01)

(52) U.S. Cl.
CPC .... *H03H 9/02574* (2013.01); *H03H 9/02669* (2013.01); *H03H 9/02866* (2013.01); *H03H 9/1085* (2013.01)

(58) Field of Classification Search
USPC ............ 310/313 A–313 D, 313 R, 334; 333/187–193
See application file for complete search history.

(56) References Cited

U.S. PATENT DOCUMENTS

| | | | |
|---|---|---|---|
| 8,512,800 B2 | 8/2013 | Godshalk et al. | |
| 2007/0296306 A1* | 12/2007 | Hauser | H03H 3/10 310/313 R |
| 2013/0234805 A1* | 9/2013 | Takahashi | H03H 9/02228 333/133 |
| 2015/0244149 A1* | 8/2015 | Van Someren | H01S 5/0607 372/20 |
| 2016/0182009 A1* | 6/2016 | Bhattacharjee | H03H 9/02574 310/313 B |
| 2017/0033756 A1 | 2/2017 | Inoue et al. | |
| 2017/0033764 A1 | 2/2017 | Inoue et al. | |
| 2017/0222618 A1 | 8/2017 | Inoue et al. | |
| 2017/0222622 A1 | 8/2017 | Solal et al. | |
| 2017/0366160 A1* | 12/2017 | Kishimoto | H03H 3/10 |
| 2017/0373241 A1* | 12/2017 | Kimura | H01L 41/047 |
| 2017/0373663 A1* | 12/2017 | Kishimoto | H03H 9/02228 |
| 2018/0102760 A1 | 4/2018 | Inoue et al. | |
| 2018/0109241 A1 | 4/2018 | Inoue et al. | |

OTHER PUBLICATIONS

Solal, M., et al., "Observation for Nonlinear Harmonic Generation of Bulk Modes in SAW Devices," 2016 IEEE International Ultrasonics Symposium, Sep. 18-21, 2016, Tours France, 4 pages.

Solal, M., et al., "Observation of Nonlinear Harmonic Generation of Bulk Modes in SAW Devices," IEEE Transactions on Ultrasonics, Ferroelectrics, and Frequency Control, vol. 64, No. 9, Sep. 2017, pp. 1361-1367.

* cited by examiner

SURFACE ACOUSTIC WAVE (SAW) DEVICE WITH ANTIREFLECTIVE STRUCTURE

PRIORITY APPLICATIONS

This application claims the benefit of provisional patent application Ser. No. 62/408,395, filed Oct. 14, 2016, the disclosure of which is hereby incorporated herein by reference in its entirety.

FIELD OF THE DISCLOSURE

The present disclosure relates to acoustic wave devices, and, in particular, to surface acoustic wave (SAW) devices configured to operate with reduced bulk mode content.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Exemplary acoustic wave devices include surface acoustic wave (SAW) resonators and bulk acoustic wave (BAW) resonators, which are increasingly used to form filters used in the transmission and reception of radio frequency (RF) signals for communication. For purposes of illustration, FIG. 1A shows details of a conventional SAW resonator 10. The conventional SAW resonator 10 includes a piezoelectric substrate 12 and an interdigital transducer (IDT) 14 on a front-side surface 16 of the piezoelectric substrate 12. The IDT 14 includes a first interdigital electrode 18A and a second interdigital electrode 18B, which are interleaved with one another as shown. Although not shown, the IDT 14 is typically placed between two reflective gratings which allow acoustic waves to reflect inside of the conventional SAW resonator 10. A backgrinding process may be used to remove a portion of the piezoelectric substrate 12 in order to reduce a thickness of the conventional SAW resonator 10.

In operation, an alternating electrical input signal provided between the first interdigital electrode 18A and the second interdigital electrode 18B is transduced into a mechanical signal in the piezoelectric substrate 12, resulting in one or more acoustic waves therein. In the case of the conventional SAW resonator 10, the resulting acoustic waves are predominantly surface acoustic waves. However, spurious bulk acoustic waves may also be generated. Spurious bulk acoustic waves (i.e., bulk mode content) can travel toward a back-side surface 20 of the piezoelectric substrate 12 and reflect back toward the front-side surface 16 of the piezoelectric substrate 12. If this occurs, the bulk acoustic waves can interfere with the surface acoustic waves and influence the response of the conventional SAW resonator 10.

To reduce costs and allow for greater miniaturization, SAW devices, such as the conventional SAW resonator 10, are often integrated into modules before packaging. For example, FIG. 1B illustrates a cross-section of the conventional SAW resonator 10 in a packaged module 22. As shown in FIG. 1B, the conventional SAW resonator 10 is flipped over so that the front-side surface 16 faces a separation plate 24 over a mounting board 26. A cavity 28 is created between the separation plate 24 and the front-side surface 16. The conventional SAW resonator 10 is aligned so that pads 30 coupled to the first interdigital electrode 18A and the second interdigital electrode 18B are coupled to pads 32 on the mounting board 26. The back-side surface 20 of the piezoelectric substrate 12 faces upward away from the mounting board 26. Notably, the backgrinding process used to reduce the thickness of the conventional SAW resonator 10 can cause the back-side surface 20 of the piezoelectric substrate 12 to become very smooth. A dielectric compound 34, such as an epoxy-based compound, encapsulates the conventional SAW resonator 10 and provides a flat surface of the packaged module 22.

The acoustic impedance of dielectric compounds is typically much smaller than the acoustic impedance of materials used for a piezoelectric substrate. With continuing reference to the exemplary packaged module 22 in FIG. 1B, the acoustic impedance of the dielectric compound 34 is much smaller than the acoustic impedance of the piezoelectric substrate 12. This impedance mismatch, along with the very smooth back-side surface 20 of the piezoelectric substrate 12 caused by the backgrinding process, can cause bulk acoustic waves generated by the conventional SAW resonator 10 to be reflected back towards the front-side surface 16 of the piezoelectric substrate 12 with a large reflection coefficient. As noted above, these bulk acoustic waves can interfere with the surface acoustic waves and influence the response of the conventional SAW resonator 10.

Conventional processes have reduced the aforementioned spurious bulk acoustic wave interference by roughening the back-side surface 20 of the piezoelectric substrate 12 before forming the dielectric compound 34 thereon. To illustrate the effects of backgrinding and roughening on the reflection of spurious bulk acoustic waves in the piezoelectric substrate 12, FIG. 2 is a graph illustrating the frequency response of the packaged module 22 at various stages. Specifically, FIG. 2 shows amplitude variations in the nonlinear frequency response due to the resonance of second harmonic bulk acoustic waves in the piezoelectric substrate 12 without backgrinding, with backgrinding, and with both backgrinding and roughening. As shown in FIG. 2, spurious bulk acoustic waves in the exemplary conventional SAW resonator 10 before backgrinding of the piezoelectric substrate 12 can result in moderate amplitudes in the nonlinear frequency response of the conventional SAW resonator 10 due to resonant second harmonic waves. After backgrinding, however, amplitudes can greatly increase due to the reflection of spurious bulk acoustic waves on the back-side surface 20 of the piezoelectric substrate 12. Roughening the back-side surface 20 of the piezoelectric substrate 12 can reduce amplitudes of resonant second harmonic waves to a level lower than before backgrinding of the piezoelectric substrate 12. But, roughening the back-side surface 20 of the piezoelectric substrate 12 can also generate fractures in the piezoelectric substrate 12, reducing the structural integrity of the packaged module 22. Further, roughening the back-side surface 20 of the piezoelectric substrate 12 can provide a scaling limit because a rough back-side surface 20 may interfere with the singulation process of the packaged module 22. Therefore, there is a need for a module including one or more SAW devices with reduced bulk mode content while remaining compatible with singulation processes for achieving small die sizes.

SUMMARY

The present disclosure relates to acoustic wave devices, and, in particular, to surface acoustic wave (SAW) devices configured to operate with reduced bulk mode content. In one embodiment, a device includes a piezoelectric substrate, an interdigital transducer (IDT), and an antireflective structure. The piezoelectric substrate has a front-side surface and a smoothed back-side surface. The IDT is on the front-side surface of the piezoelectric substrate. The antireflective structure is on at least a portion of the smoothed back-side surface of the piezoelectric substrate. By having the antireflective structure on at least a portion of the smoothed back-side surface of the piezoelectric substrate, reflection of spurious bulk acoustic waves toward the front-side surface of the piezoelectric substrate can be reduced and/or eliminated to lessen interference with surface acoustic waves. The reduction and/or elimination of spurious bulk acoustic waves allows the device to forego conventional roughening of the back-side surface of the piezoelectric substrate, thereby reducing fractures at the back-side surface and allowing for singulation techniques capable of producing smaller die sizes.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
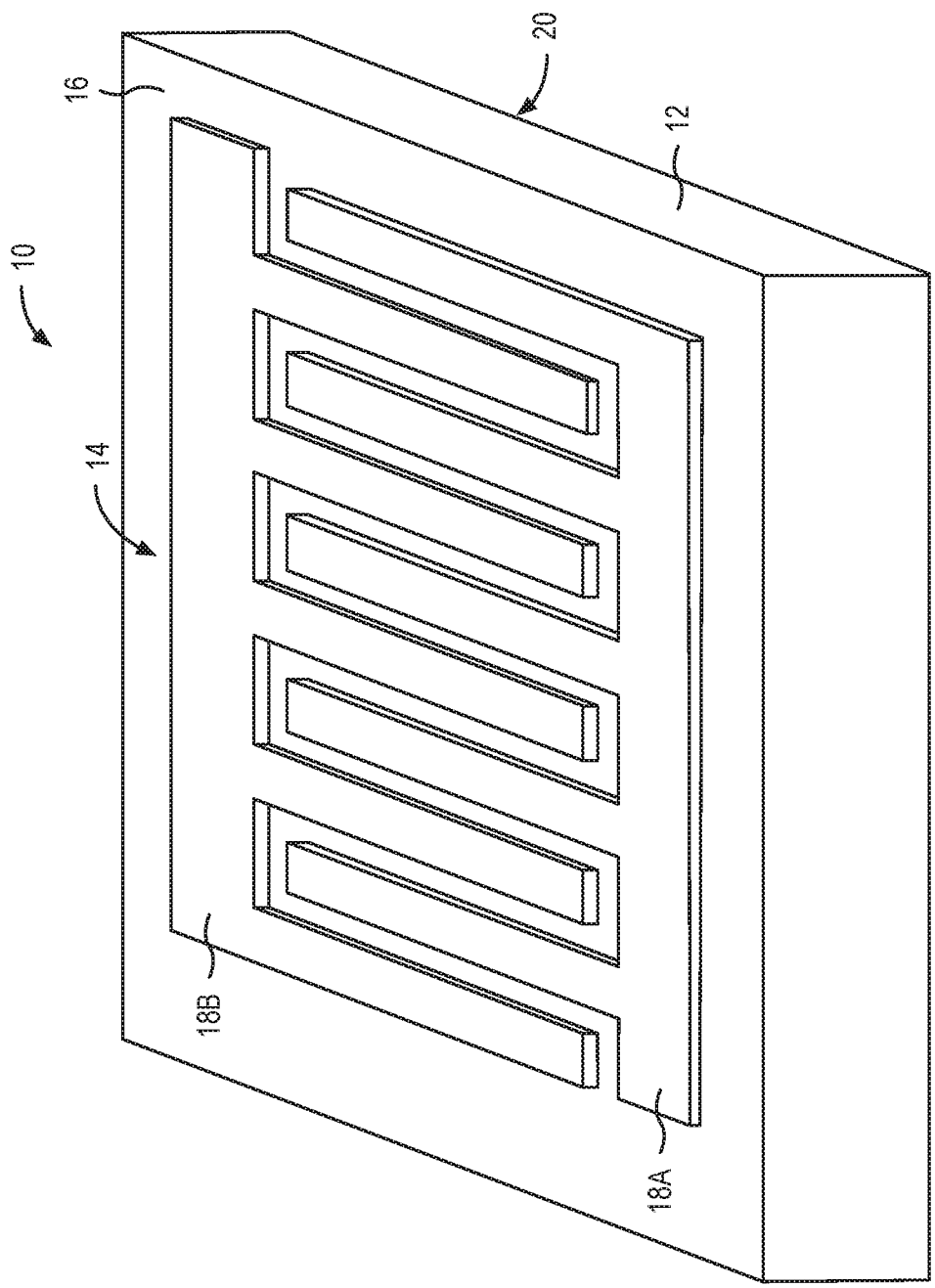
FIG. 1A is a conventional surface acoustic wave (SAW) resonator.
Figure 1B:
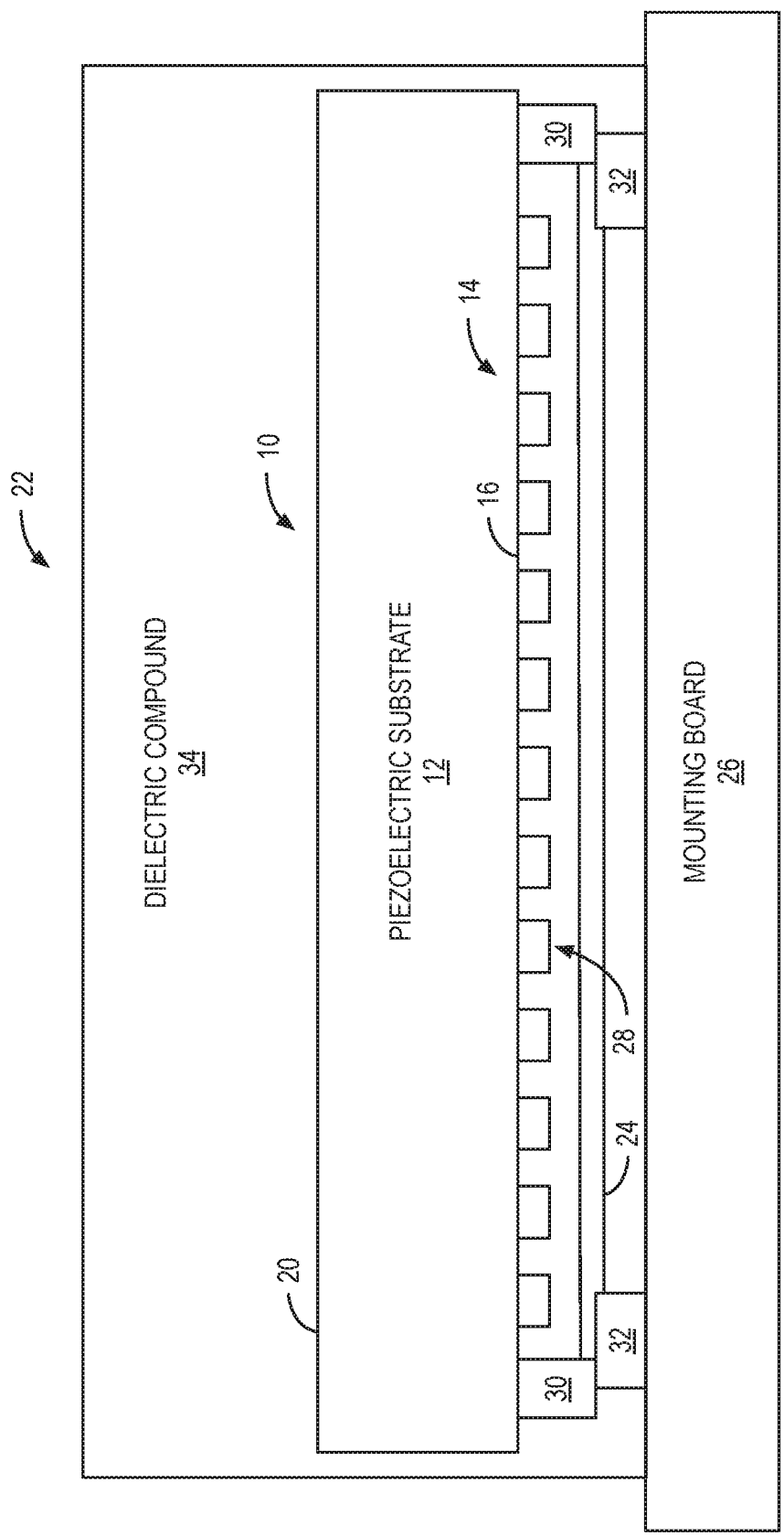
FIG. 1B is a cross-sectional view of the conventional SAW resonator in FIG. 1A in a packaged module.
Figure 2:
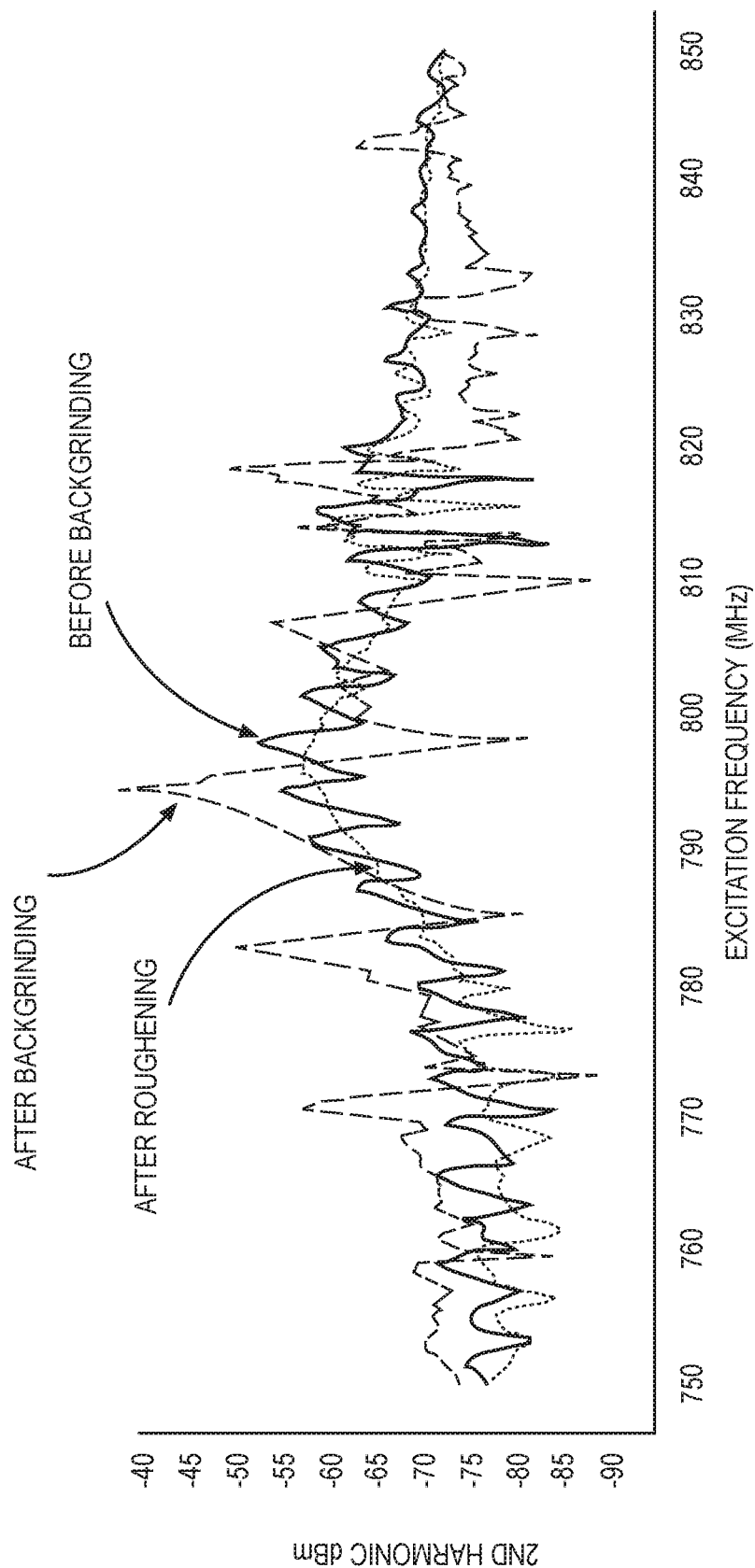
FIG. 2 is a graph illustrating the nonlinear frequency response of the packaged module illustrated in FIG. 1B at various stages.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3A:
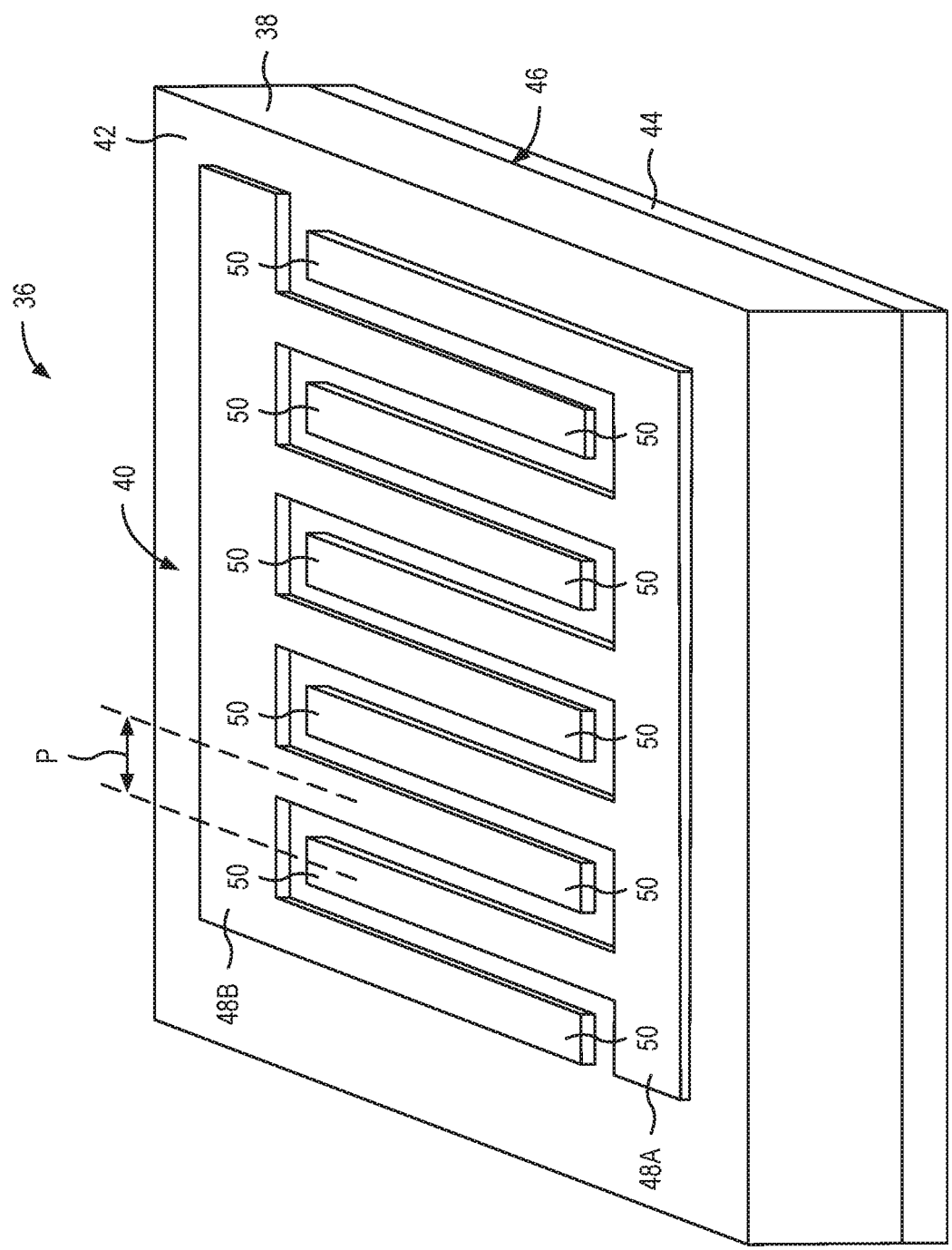
FIG. 3A is an exemplary SAW resonator including an antireflective structure for reducing bulk mode content.
Figure 3B:
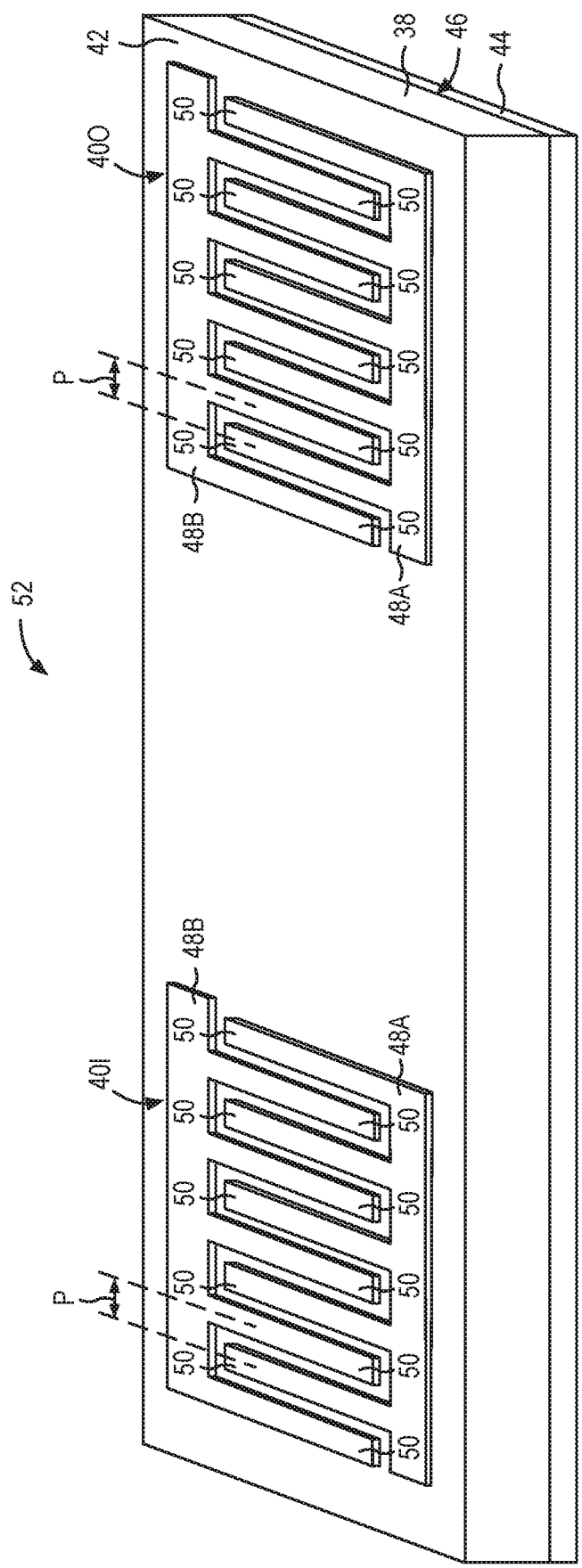
FIG. 3B is an exemplary SAW filter including an antireflective structure for reducing bulk mode content.

FIG. 3A is an exemplary surface acoustic wave (SAW) resonator 36 configured to reduce bulk mode content. The SAW resonator 36 includes a piezoelectric substrate 38. An interdigital transducer (IDT) 40 is on a front-side surface 42 of the piezoelectric substrate 38. The SAW resonator 36 also includes an antireflective structure 44 on a smoothed back-side surface 46 of the piezoelectric substrate 38. The IDT 40 includes a first interdigital electrode 48A and a second interdigital electrode 48B, each of which have fingers 50 interleaved with one another as shown. A distance between adjacent fingers 50 of the first interdigital electrode 48A and the second interdigital electrode 48B defines an electrode period P of the IDT 40. FIG. 3B is an exemplary SAW filter 52 configured to reduce bulk mode content. The SAW filter 52 in this example includes an input IDT 401 and an output IDT 400. The input IDT 401 and the output IDT 400 are each similar to the SAW resonator 36 illustrated in FIG. 3A.

Figure 4:
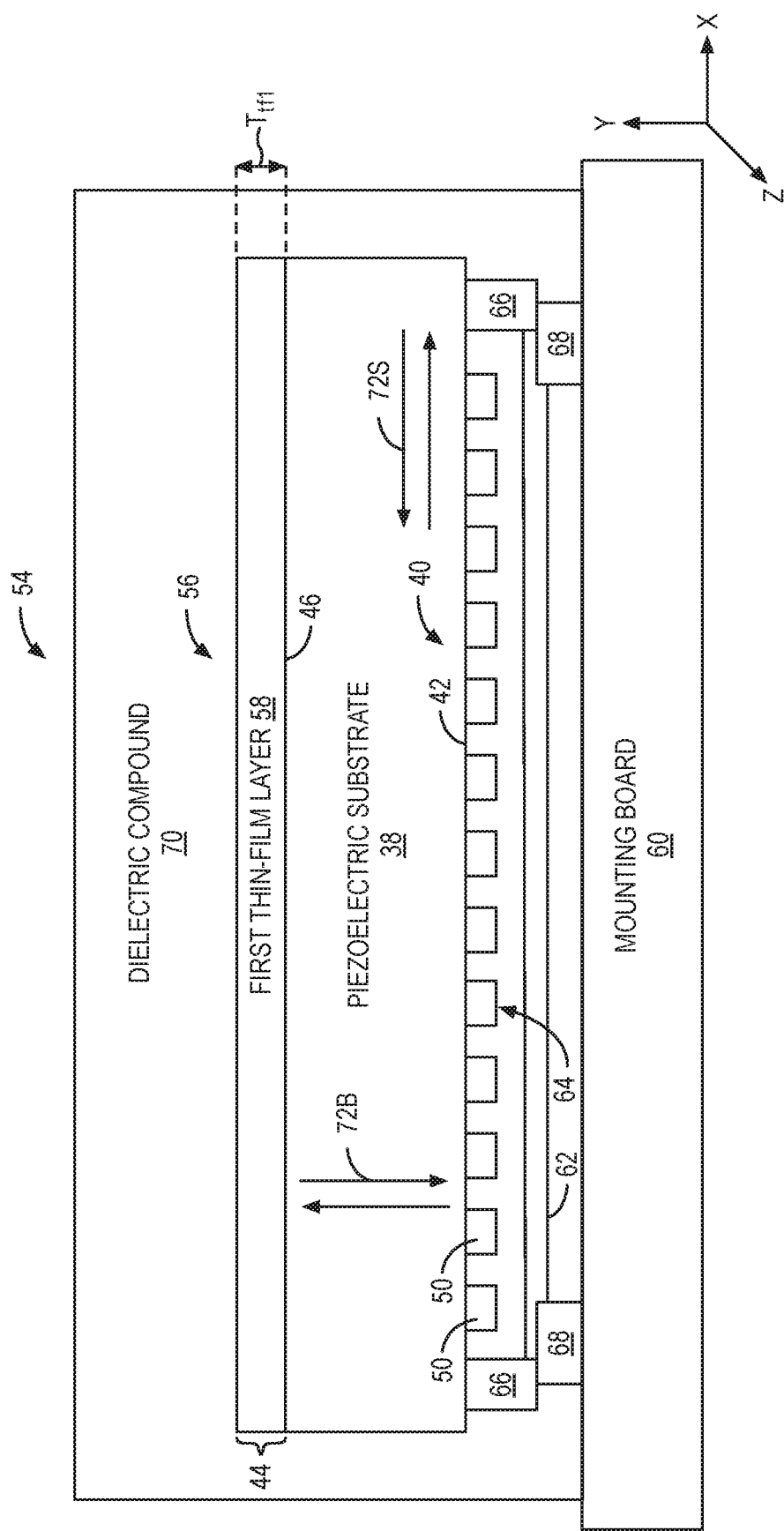
FIG. 4 is a cross-sectional view of an exemplary packaged module containing a SAW device having an antireflective structure configured to operate with reduced bulk mode content.

FIG. 4 is a cross-sectional view of an exemplary packaged module 54 containing a SAW device 56 configured to operate with reduced bulk mode content according to one embodiment. The IDT 40 is on the front-side surface 42 of the piezoelectric substrate 38 and includes the fingers 50 of the interdigital electrodes 48A and 48B. In this example, the SAW device 56 is either a resonator, such as the SAW resonator 36 illustrated in FIG. 3A, or a filter, such as the SAW filter 52 illustrated in FIG. 3B. The antireflective structure 44 in this example includes a first thin-film layer 58. The antireflective structure 44 may also include additional thin-film layers, as described in further detail below. The SAW device 56 is positioned on a mounting board 60 such that the front-side surface 42 of the piezoelectric substrate 38 faces a separation plate 62. A cavity 64 is created between the separation plate 62 and the front-side surface 42. The SAW device 56 is aligned so that pads 66 coupled to the IDT 40 are coupled to pads 68 on the mounting board 60. A dielectric compound 70 encapsulates the SAW device 56 and provides a flat surface of the packaged module 54.

During operation, an alternating electrical input signal is transduced into a mechanical signal in the piezoelectric substrate 38, resulting in one or more acoustic waves therein. In this example, the resulting acoustic waves are predominantly surface acoustic waves 72S that propagate parallel to the X-Z plane. However, spurious longitudinal bulk acoustic waves 72B that propagate in the X-Y plane (i.e., perpendicular to the X-Z plane or at an angle to the X-Z plane) can also be generated. In some conventional SAW devices, spurious longitudinal bulk acoustic waves (i.e., bulk mode content) reflect off of the back-side surface of the piezoelectric substrate and interfere with the surface acoustic waves, influencing the linear response of the SAW device. As noted above, some conventional SAW devices provide a roughened back-side surface of the piezoelectric substrate to reduce such bulk acoustic wave reflection as a means to reduce interference with the surface acoustic waves. However, one downside to providing a roughened back-side surface is that roughening processes can fracture the piezoelectric substrate, thereby reducing the structural integrity of the SAW device. Further, a roughened back-side surface can also limit dicing processes.

Thus, in embodiments disclosed herein, the antireflective structure 44 is configured to suppress the reflection of the spurious longitudinal bulk acoustic waves 72B. The antireflective structure 44 is configured to suppress bulk acoustic wave reflection by having an acoustic impedance and/or a thickness such that the spurious longitudinal bulk acoustic waves 72B can easily pass through the smoothed back-side surface 46 and not be reflected back into the piezoelectric substrate 38. By allowing the longitudinal bulk acoustic waves 72B to exit the piezoelectric substrate 38, nonlinear harmonic wave generation can be diminished, and the bulk acoustic waves that would otherwise interfere with the surface acoustic waves can be reduced and/or eliminated. By reducing such waves, unwanted frequency components can be removed from the alternating electrical signal while preserving desired a frequency response. In this manner, greater frequency selectivity of the SAW device 56 can be achieved. Further, providing the antireflective structure 44 configured to suppress bulk acoustic wave reflection reduces and/or eliminates the need for a roughened back-side surface. By not roughening the back-side surface 46, fractures in the piezoelectric substrate 38 can be avoided and singulation processes made easier, all while reducing surface acoustic wave interference caused by bulk acoustic wave reflections. In this manner, SAW devices with reduced bulk mode content and thus greater frequency selectivity can be provided in packaged modules with greater structural integrity and at smaller die sizes than conventional SAW devices.

With continuing reference to FIG. 4, the first thin-film layer 58 in the antireflective structure 44 can be configured to suppress the reflection of the longitudinal bulk acoustic waves 72B by having a first thin-film acoustic impedance $Z_{tf1}$ and a first thin-film thickness $T_{tf1}$ such that the longitudinal bulk acoustic waves 72B can easily pass through the smoothed back-side surface 46 without being reflected back into the piezoelectric substrate 38. This device behavior can be obtained by selecting a material for the first thin-film layer 58 with a first thin-film acoustic impedance $Z_{tf1}$ between a piezoelectric acoustic impedance $Z_P$ of the piezoelectric substrate 38 and a dielectric acoustic impedance $Z_C$ of the dielectric compound 70. In this manner, better impedance matching between the piezoelectric substrate 38 and the dielectric compound 70 can be provided. Perfect reflection suppression can occur when the first thin-film thickness $T_{tf1}$ of the first thin-film layer 58 is equal to one-quarter of a wavelength (i.e., $\frac{1}{4}\lambda_{BAW}$) of the longitudinal bulk acoustic waves 72B in the first thin-film layer 58 and the first thin-film acoustic impedance $Z_{tf}$ equals the square root of the product of the piezoelectric acoustic impedance $Z_P$ and the dielectric acoustic impedance $Z_C$. The following equations describe such characteristics:

$$Z_{tf1} = \sqrt{Z_P Z_C} \qquad \text{Equation 1}$$

$$T_{tf1} = \tfrac{1}{4}\lambda_{BAW} \qquad \text{Equation 2}$$

Equations 1 and 2 may also be used in an approximative manner such that at least some reflection suppression can be achieved when the first thin-film thickness $T_{tf1}$ of the first thin-film layer 58 is approximately equal to one-quarter of a wavelength (i.e., $\frac{1}{4}\lambda_{BAW}$) of the longitudinal bulk acoustic waves 72B in the first thin-film layer 58 and the first thin-film acoustic impedance $Z_{tf}$ approximately equals the square root of the product of the piezoelectric acoustic impedance $Z_P$ and the dielectric acoustic impedance $Z_C$. In the equations above, the acoustic impedances and the wavelengths are for the longitudinal mode. The wavelength $\lambda_{BAW}$ is a wavelength of the longitudinal bulk acoustic waves 72B in the first thin-film layer 58. The acoustic longitudinal mode is a mechanical wave such that the mechanical displacement is in the same direction as the propagation of the mechanical wave. A shear wave is a mechanical wave such that the mechanical displacement is perpendicular to the direction of the propagation of the mechanical wave.

Since the acoustic impedance of a material is an inherent feature defined as the product of the density of the material and the acoustic velocity in the material, selecting a material with an acoustic impedance that satisfies Equation 1 above is a primary concern. In the SAW device 56 in FIG. 4, the piezoelectric substrate 38 is made of lithium niobate (LiNbO$_3$) with an approximate orientation of Y+127 degrees. The density of LiNbO$_3$ is approximately 4650 kilograms per cubic meter (kg/m$^3$) and the longitudinal acoustic velocity in the Y-direction (as defined by the XYZ axis illustrated in FIG. 4 and not the Y-direction of the crystal) in this orientation is approximately 7100 meters per second (m/s). Since acoustic impedance is the product of acoustic velocity and density, the piezoelectric acoustic impedance $Z_P$ is approximately 33 MegaRayleigh (MRayleigh). The velocity of the acoustic longitudinal mode (also referred to as the elastic longitudinal mode) in the piezoelectric substrate 38 is the square root of the stiffness of the material of the piezoelectric substrate 38 in the longitudinal direction divided by the density of the material of the piezoelectric substrate 38. In other embodiments, the piezoelectric substrate 38 may be made of compounds such as, but not limited to, quartz and/or lithium tantalate (LiTaO$_3$). In some embodiments, the piezoelectric substrate 38 can be on a front-side surface of a second substrate and the antireflective structure 44 can be on a back-side surface of the second substrate. For example, in some embodiments, the piezoelectric substrate 38 can be laminated on top of a second substrate including Silicon (Si). In additional embodiments, the second substrate may include materials such as, but not limited to, quartz and/or non-piezoelectric materials. In a case where the piezoelectric substrate 38 is formed over a second substrate, the acoustic impedance of the second substrate may be considered to avoid reflection. The first thin-film layer 58 may have a thickness such as, but not limited to, +/−20% of one-quarter of the wavelength $\lambda_{BAW}$ of the longitudinal bulk acoustic waves 72B, in the first thin-film layer 58. If the mode to be attenuated is a shear mode, then the velocity and impedances of the shear mode may be considered instead of the velocity of the longitudinal mode. The piezoelectric substrate 38 may also have an orientation such as, but not limited to, between Y+110 degrees to Y+140 degrees and between Y−10 degrees and Y+60 degrees. In additional embodiments, the piezoelectric substrate 38 may be made of LiTaO$_3$ having an orientation between Y+10 degrees and Y+60 degrees. The dielectric compound 70 in the example illustrated in FIG. 4 is made out of loaded epoxy. The density of the loaded epoxy of the dielectric compound 70 is approximately 2000 kg/m$^3$ and the acoustic velocity is approximately between 2000 and 4000 m/s. In this manner, the dielectric acoustic impedance $Z_C$ is approximately between 4 MRayleigh and 8 MRayleigh. In additional embodiments, the dielectric compound 70 may include materials such as, but not limited to, epoxy, plastic, metals, and/or glass, and may have a dielectric acoustic impedance lower than the acoustic impedance of the piezoelectric substrate 38.

Based on the piezoelectric acoustic impedance $Z_P$ and the dielectric acoustic impedance $Z_C$ derived above with regard to this example, the improved first thin-film acoustic impedance $Z_{tf1}$ for reflection suppression can be calculated using Equation 1 to be between approximately 11.5 MRayleigh and 16 MRayleigh. Since the acoustic impedance of silicon oxide is approximately 13 MRayleigh to 15 MRayleigh—a value which provides an improved reflection suppression impedance calculated in this example—the first thin-film layer 58 in FIG. 4 is selected to be made of silicon dioxide (SiO$_2$) in this example. In this manner, the first thin-film layer 58 in the example in FIG. 4 is configured to have a first thin-film acoustic impedance $Z_{tf1}$ such that the longitudinal bulk acoustic waves 72B can be reduced and/or eliminated. In some embodiments, the first thin-film layer 58 is made of SiO$_x$, where x is approximately 2, but may not be equal to exactly 2.

As illustrated in Equation 2, providing improved reflection suppression includes providing a first thin-film thickness $T_{tf1}$ equal to one-quarter of a wavelength of a longitudinal bulk acoustic wave. In the example in FIG. 4, the SAW device 56 is a SAW filter and the first thin-film thickness $T_{tf1}$ formed for improved reflection suppression is approximately equal to one-quarter of a wavelength $\lambda_{BAW}$ of the longitudinal bulk acoustic waves 72B at a frequency which is twice a center frequency $f_0$ of the SAW device 56, wherein $f_0$ is the center frequency of a passband for the SAW device 56. In one embodiment, the acoustic velocity in the first thin-film layer 58 is approximately 6100 m/s and the center frequency of the SAW device 56 is approximately 1 gigahertz (GHz). As such, the wavelength of the longitudinal bulk acoustic waves 72B at 2 GHz is approximately 3.05 micrometers (μm). Thus, according to Equation 2, providing the first thin-film thickness $T_{tf1}$ approximately equal to 760 nanometers (nm) (i.e., approximately one-quarter of the wavelength $\lambda_{BAW}$) can improve reflection suppression of the longitudinal bulk acoustic waves 72B in the SAW device 56, which is configured as a SAW filter. In additional embodiments, the SAW device 56 can have a center frequency $f_0$ such as, but not limited to, between 10 MHz and 5 GHz. Further, the first thin-film layer 58 may have a first thin-film thickness $T_{tf1}$ such as, but not limited to, less than the period P of the IDT 40, or twice the period P. In additional embodiments, the first thin-film thickness $T_{tf1}$ may be between 25% and 50% of the period P of the IDT 40.

Figure 5:
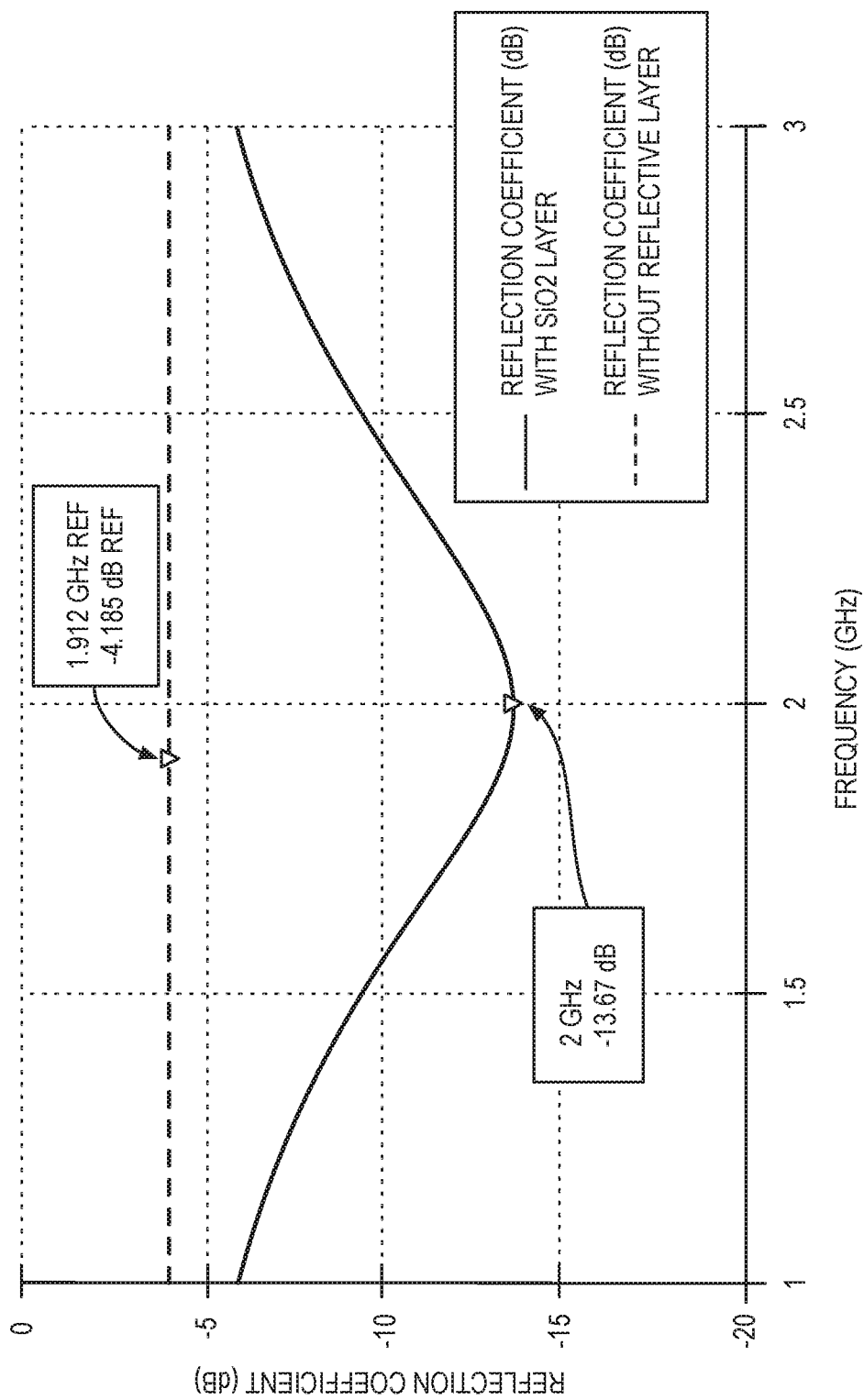
FIG. 5 is a graph of the reflectivity of the bulk acoustic waves illustrated in FIG. 4 with and without a first thin-film layer across a spectrum of operating frequencies.

As illustrated in the discussion above, making the first thin-film layer 58 out of SiO$_2$ with a first thin-film thickness $T_{tf1}$ of approximately 760 nm can provide improved reflection suppression of the longitudinal bulk acoustic waves 72B in the SAW device 56 in FIG. 4. This behavior is further illustrated in FIG. 5. FIG. 5 is a graph of the reflectivity of the bulk acoustic waves 72B with and without the first thin-film layer 58 across a spectrum of frequencies of the SAW device 56. As shown in FIG. 5, the reflection coefficient (i.e., the percentage of the longitudinal bulk acoustic waves 72B reflected) without the first thin-film layer 58 stays relatively high and constant, with a reflection coefficient of approximately −4.185 decibels (dB), meaning that the longitudinal bulk acoustic waves 72B are reflected to a large degree. However, the reflection coefficient with the first thin-film layer 58 on the smoothed back-side surface 46 of the piezoelectric substrate 38 is reduced, reaching a minimum value of −13.67 dB at 2 GHz. In this regard, the reflection coefficient of the longitudinal bulk acoustic waves 72B in the SAW device 56 with the first thin-film layer 58 is reduced by about 9 dB. It is also notable that even at frequencies from 1 GHz to 3 GHz, the reflection coefficient of the longitudinal bulk acoustic waves 72B in the SAW device 56 with the first thin-film layer 58 is lower than the reflection coefficient without the first thin-film layer 58. Particularly, reflection is reduced by 5 dB inside a band from 1.5 GHz to 2.5 GHz.

Figure 6:
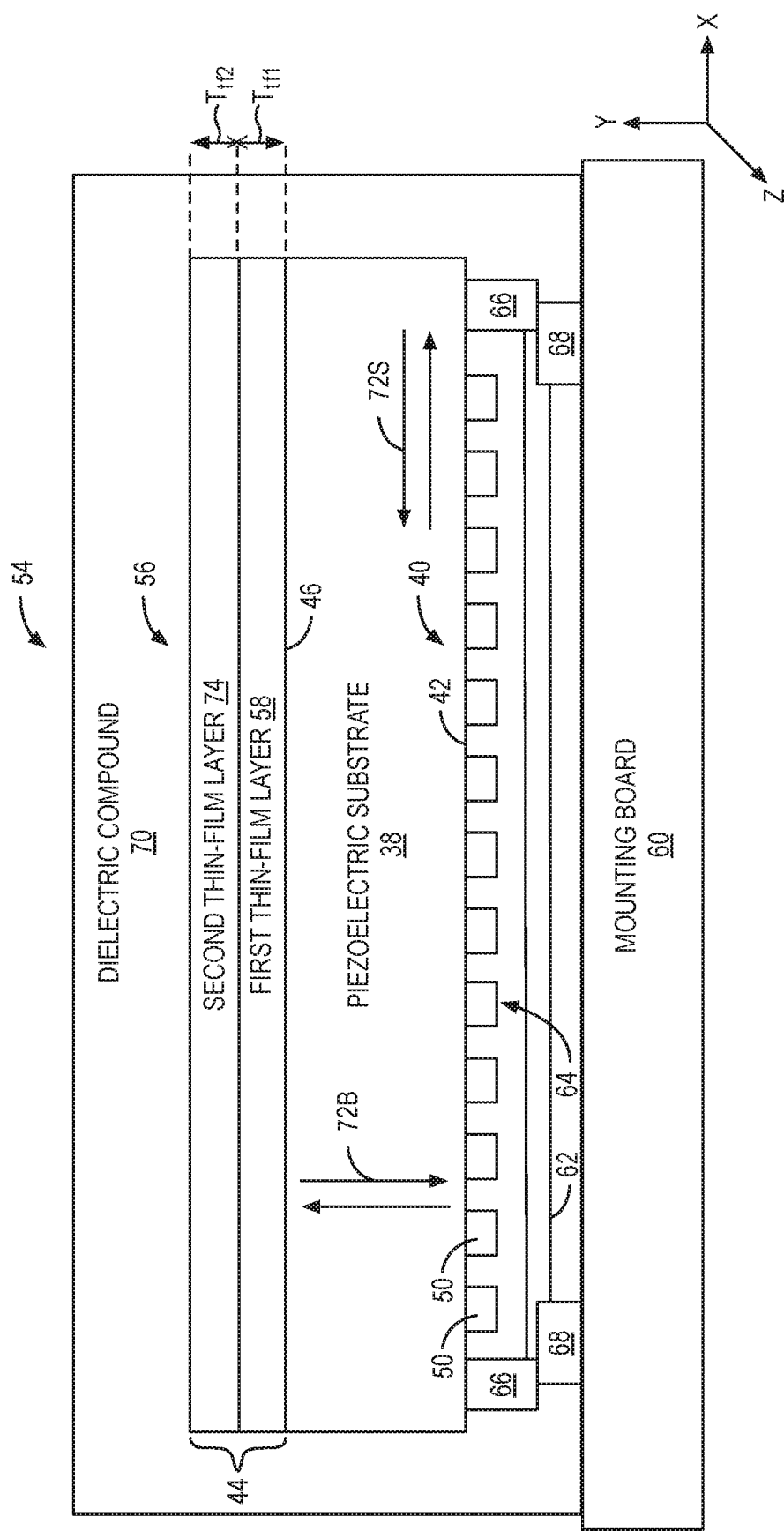
FIG. 6 is a cross-sectional view of the exemplary packaged module illustrated in FIG. 4, wherein the antireflective structure includes a first thin-film layer and a second thin-film layer.

By using several thin-film layers having selected thicknesses and acoustic impedances in the antireflective structure 44, it is possible to minimize the reflectivity of several frequency bands. Additionally, providing thin-film layers of intermediate acoustic impedances between high and low acoustic impedance layers may make impedance matching easier. Additional embodiments include using a succession of low-impedance and high-impedance films, each having a thickness of about a quarter wavelength. For example, FIG. 6 is a cross-sectional view of the exemplary packaged module 54 containing the SAW device 56, wherein the antireflective structure 44 includes the first thin-film layer 58 and a second thin-film layer 74. The second thin-film layer 74 in this example is made of titanium (Ti), which has a second thin-film acoustic impedance $Z_{tf2}$ of approximately 27 MRayleigh. However, the second thin-film layer 74 may also be made of materials such as, but not limited to, Si, silicon nitride (SiN), and/or aluminum nitride (AlN), and may have a second thin-film acoustic impedance $Z_{tf2}$ such as, but not limited to, approximately 20 MRayleigh, 24 MRayleigh, and/or 33 MRayleigh. In additional embodiments, the first thin-film layer 58 and the second thin-film layer 74 may be combined in varying combinations of materials. For example, in one embodiment, the first thin-film layer 58 may be made of $SiO_2$ and the second thin-film layer 74 may be made of Ti. In another embodiment, the first thin-film layer 58 may be made of $SiO_2$ and the second thin-film layer 74 may be made of SiN.

Since the first thin-film layer 58 has a first thin-film acoustic impedance $Z_{tf1}$ of approximately 13 MRayleigh to 15 MRayleigh and the piezoelectric substrate 38 has a piezoelectric acoustic impedance $Z_P$ of approximately 33 MRayleigh, providing the second thin-film layer 74 with a second thin-film acoustic impedance $Z_{tf2}$ between 15 MRayleigh and 33 MRayleigh can provide better impedance matching between the piezoelectric substrate 38 and the first thin-film layer 58. By providing better impedance matching between the first thin-film layer 58 and the piezoelectric substrate 38, the transition of the longitudinal bulk acoustic waves 72B from the piezoelectric substrate 38 to the first thin-film layer 58 can be smoothed, further reducing the reflectivity of the smoothed back-side surface 46 of the piezoelectric substrate 38. An improved thickness for reducing bulk acoustic wave reflection for an additional thin-film layer can be calculated using Equation 2. In this manner, a second thin-film thickness $T_{tf2}$ of the second thin-film layer 74 can be calculated to be one-quarter of a wavelength $\lambda_{BAW}$ of the longitudinal bulk acoustic waves 72B in the second thin-film layer 74. In the example in FIG. 6, one-quarter of the wavelength $\lambda_{BAW}$ of the longitudinal bulk acoustic waves 72B in the second thin-film layer 74 is approximately 760 nm. While the second thin-film thickness $T_{tf2}$ is approximately the same as the first thin-film thickness $T_{tf1}$ in this example, the first thin-film thickness $T_{tf1}$ and the second thin-film thickness $T_{tf2}$ may also be different. In additional embodiments, the second thin-film thickness $T_{tf2}$ can include thicknesses such as, but not limited to, a thickness equal to a quarter of the wavelength in the second thin-film layer 74 at the frequency of the bulk mode. In additional embodiments, the second thin-film thickness $T_{tf2}$ may be between 25% and 50% of a period of the IDT 40. In additional embodiments, at least one of the first thin-film layer 58 and the second thin-film layer 74 has a thickness less than the wavelength of the bulk mode in the layer at the frequency of the bulk mode, such as the longitudinal mode, to be attenuated.

Figure 7:
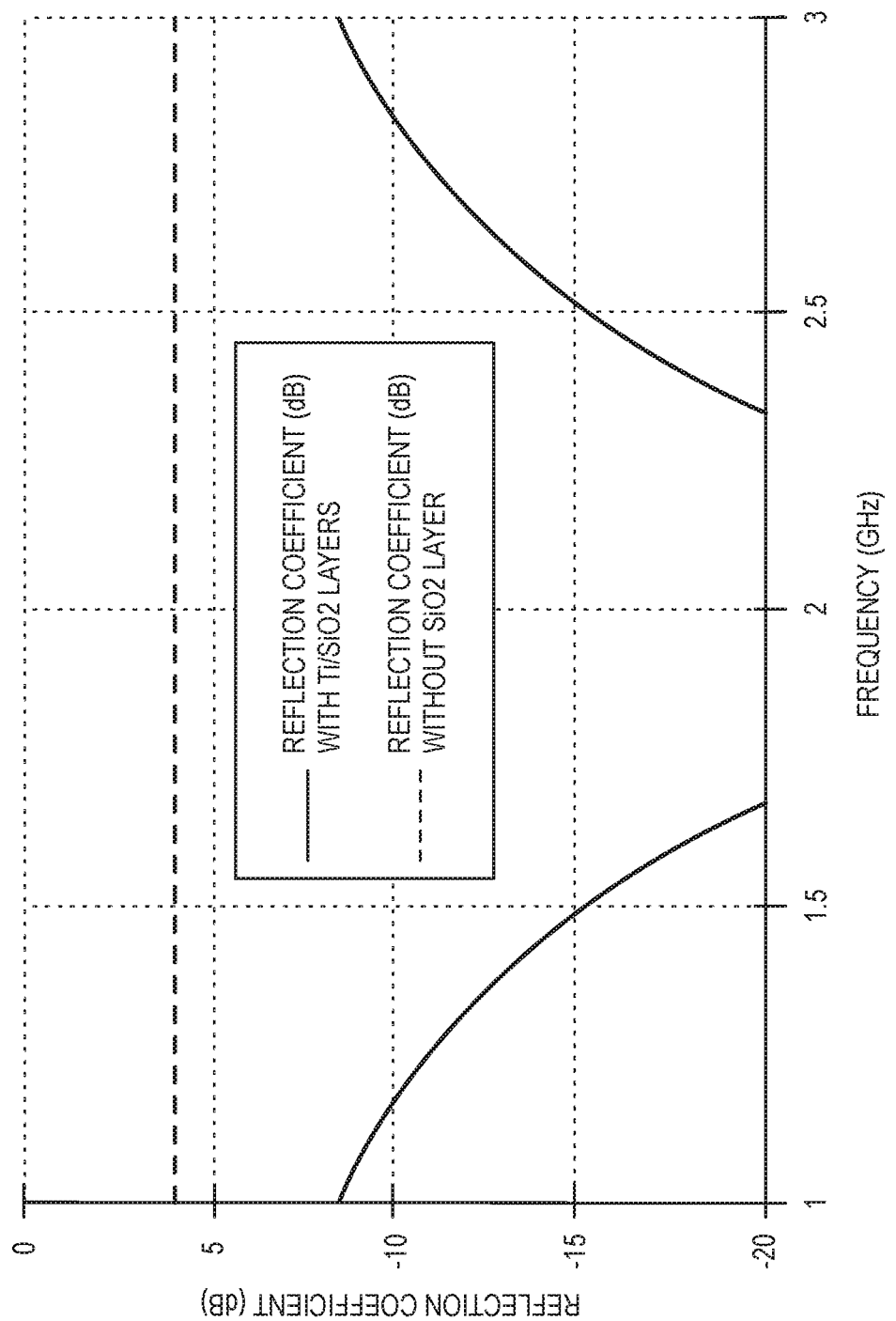
FIG. 7 is a graph of the reflectivity of the bulk acoustic waves illustrated in FIG. 6 with and without the first thin-film layer and the second thin-film layer across a spectrum of operating frequencies.

FIG. 7 is a graph of the reflectivity of the bulk acoustic waves 72B with and without the first thin-film layer 58 and the second thin-film layer 74 across a spectrum of frequencies of the SAW device 56. As shown in FIG. 7, the reflection coefficient without the first thin-film layer 58 and the second thin-film layer 74 stays relatively high and constant, indicating that the longitudinal bulk acoustic waves 72B are reflected to a large degree. However, the reflection coefficient of the SAW device 56 having the first thin-film layer 58 and the second thin-film layer 74 is reduced, reaching a minimum value below −20 dB between approximately 1.7 GHz and 2.3 GHz. In this regard, the reflection coefficient of the longitudinal bulk acoustic waves 72B in the SAW device 56 with the first thin-film layer 58 and the second thin-film layer 74 is reduced. In comparison to the graph in FIG. 5 illustrating reflectivity when using only one thin-film layer, the graph in FIG. 7 shows that using two appropriately-selected thin-film layers can reduce reflectivity even further. In this manner, enhanced reflection suppression of longitudinal bulk acoustic waves can be achieved.

Figure 8:
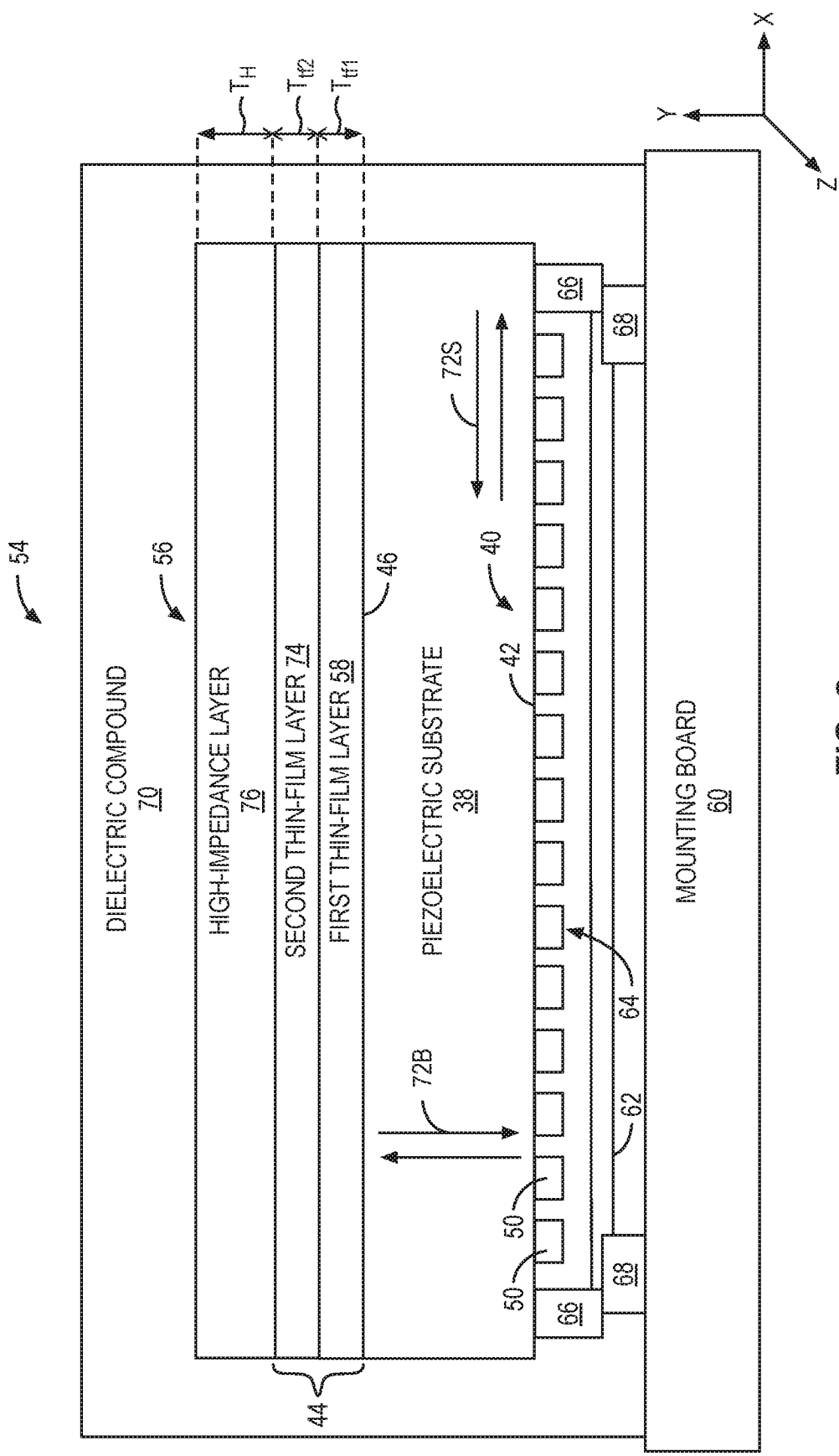
FIG. 8 is a cross-sectional view of the exemplary packaged module illustrated in FIG. 4 having a high-impedance layer on the antireflective structure.

To simplify the choice of the material(s) used in the antireflective structure 44 or to achieve good impedance matching in a wider band of frequencies, it may be advantageous to add a high-impedance layer with an acoustic impedance higher than the dielectric acoustic impedance $Z_C$ of the dielectric compound 70. For example, FIG. 8 is a cross-sectional view of the exemplary packaged module 54 containing the SAW device 56, wherein a high-impedance layer 76 is included on the antireflective structure 44. The high-impedance layer 76 in this example is made of a composite using tungsten metal which has a large impedance inside an organic material. This material may be chosen to have both a larger impedance than the dielectric compound 70 and to absorb acoustic waves. In this case, the high-impedance layer 76 is different from the first thin-film layer 58 and the second thin-film layer 74 because the high-impedance layer 76 is not a thin film and is absorbing. Rather, a high-impedance thickness $T_H$ of the high-impedance layer 76 is at least ten times the period P of the IDT 40.

In additional embodiments, the SAW device 56 can be used as a filter. In such embodiments, the SAW device 56 can be configured to receive an input signal and generate a filtered output signal based on the received input signal. In some embodiments, the SAW device 56 can act as a bandpass filter. In additional embodiments, the SAW device 56 can act as a low-pass filter, a high-pass filter, and/or a band-stop filter. In additional embodiments, the SAW device 56 can act as a sensor. The SAW device 56 can also be implemented in a "ladder filter" or "impedance element" architecture, wherein several resonators are connected in a ladder-type schematic. The SAW device 56 can also be implemented in a "coupled resonator filter" (CRF), a "double-mode SAW" (DMS), and/or a "multi-mode SAW" (MMS) architecture. CRF stages may also be cascaded to ladder stages. In additional embodiments, several SAW devices, such as the SAW device 56, can be associated together in a circuit to form a duplexer and/or a multiplexer.

In some embodiments, the SAW device 56 can be used for carrier aggregation applications. In such applications, several SAW devices (such as several variations of the SAW device 56) can be configured to act as filters of varying frequencies and can be connected to a common antenna port in parallel through some matching component(s). Reflection of bulk acoustic waves on the back-side surface for one of these filters can lead the filter to present a real impedance at the antenna and can induce losses for the other filters. This can be avoided by using antireflective structures, as shown in the examples discussed above. In this scenario, the bulk acoustic waves may not propagate solely in the Y-direction. Rather, the propagation angle of the bulk acoustic waves may depend on the frequency of the SAW device 56 and on the nature of bulk mode, which can be shear or longitudinal. The propagation angle of the bulk acoustic waves can include a propagation angle normal to the surface and/or oblique. In this manner, the selected layer thickness can depend on the propagation angle and is, in general, different from one-quarter of a wavelength. However, such a thickness may still be based on a wavelength of a bulk acoustic wave, wherein the wavelength corresponds to twice the center frequency of a given SAW device.

In some embodiments disclosed herein, the back-side surface 46 of the piezoelectric substrate 38 can have a roughness average (RA) such as, but not limited to, less than 20 nm. The RA, also known as the arithmetic average or the center line average, is the arithmetic average of the absolute values of the roughness profile ordinates. In some embodiments disclosed herein, the antireflective structure 44 can cover between 0% and 100% of the back-side surface 46 of the piezoelectric substrate 38, and can have a thickness such as, but not limited to, a thickness between 0.5 and 5 µm. In embodiments disclosed herein, the antireflective structure 44 is over an active area of the packaged module 54, wherein the active area includes areas containing an IDT, at or near an IDT, and/or between IDTs. In embodiments disclosed herein, the antireflective structure 44 is over at least 20% of the active area and up to 100% of the active area. In some embodiments, the IDT(s) 40 can be embedded in a layer including a dielectric material. For example, the IDT(s) 40 can be embedded in a dielectric material such as silicon oxide to reduce the temperature sensitivity of the SAW device 56. In some embodiments, the dielectric material for reducing temperature sensitivity can be on the IDT(s) 40. In some embodiments, thin-film layers are deposited after separating different dies in a wafer. In some embodiments, thin-film layers are deposited after separating dies and assembling the dies in a circuit. In some embodiments, the thin-film impedances and thicknesses are chosen to reduce the real part of the input admittance of the filter at one of its ports. In additional embodiments, a piezoelectric film can be included at the surface of the piezoelectric substrate 38. Also, one or more dielectric layers can be included on top of the IDT(s) 40 and/or between a piezoelectric film and the piezoelectric substrate 38.

Those skilled in the art will recognize improvements and modifications to the preferred embodiments of the present disclosure. All such improvements and modifications are considered within the scope of the concepts disclosed herein and the claims that follow.

What is claimed is:
1. A device comprising:
    a piezoelectric substrate comprising:
        a front-side surface; and
        a back-side surface;
    an interdigital transducer (IDT) on the front-side surface of the piezoelectric substrate;
    an antireflective structure on at least a portion of the back-side surface of the piezoelectric substrate; and
    a dielectric compound on the antireflective structure.
2. The device of claim 1, wherein the antireflective structure comprises a first thin-film layer having a first thin-film thickness less than a period of the IDT.
3. The device of claim 1, wherein:
    the IDT is configured to generate longitudinal bulk acoustic waves in the piezoelectric substrate; and
    the antireflective structure comprises a first thin-film layer having a first thin-film thickness approximately equal to one-quarter of a wavelength of the longitudinal bulk acoustic waves.
4. The device of claim 1, wherein the antireflective structure comprises a first thin-film layer having a first thin-film thickness approximately equal to one quarter of a wavelength of a longitudinal mode in the first thin-film layer.
5. The device of claim 1, wherein the antireflective structure comprises a first thin-film layer having a first thin-film thickness less than a period of the IDT and approximately equal to one quarter of a wavelength of a longitudinal mode in the first thin-film layer.
6. The device of claim 1, wherein the antireflective structure comprises a first thin-film layer having a first thin-film thickness approximately equal to one quarter of a wavelength of a longitudinal mode in the first thin-film layer at twice a center frequency of the device.
7. The device of claim 3, further comprising:
    a second IDT on the front-side surface of the piezoelectric substrate, wherein:
        the device is a surface acoustic wave (SAW) filter having a passband that has a center frequency; and
        the wavelength of the longitudinal bulk acoustic waves is defined at twice the center frequency of the passband of the device.
8. The device of claim 1, wherein:
    the IDT is configured to generate bulk acoustic waves in the piezoelectric substrate; and
    the antireflective structure comprises a first thin-film layer having a first thin-film thickness based on a wavelength of the bulk acoustic waves.
9. The device of claim 8, further comprising:
    a second IDT on the front-side surface of the piezoelectric substrate, wherein:
        the device is a surface acoustic wave (SAW) filter having a passband that has a center frequency; and
        the wavelength of the bulk acoustic waves is defined at twice the center frequency of the passband of the device.
10. The device of claim 1, wherein:
    the dielectric compound has a dielectric acoustic impedance;
    the piezoelectric substrate has a piezoelectric acoustic impedance; and
    the antireflective structure comprises a first thin-film layer having a first thin-film acoustic impedance approximately equal to the square root of the product of the dielectric acoustic impedance and the piezoelectric acoustic impedance.
11. The device of claim 1, wherein:
    the dielectric compound has a dielectric acoustic impedance; and
    the antireflective structure comprises a first thin-film layer having a first thin-film acoustic impedance based on the dielectric acoustic impedance.

12. The device of claim 11, wherein:
the piezoelectric substrate has a piezoelectric acoustic impedance; and
the first thin-film acoustic impedance is further based on the piezoelectric acoustic impedance.

13. The device of claim 1, wherein:
the IDT is configured to generate longitudinal bulk acoustic waves in the piezoelectric substrate;
the antireflective structure comprises a first thin-film layer having a first thin-film thickness approximately equal to one-quarter of a wavelength of the longitudinal bulk acoustic waves;
the dielectric compound has a dielectric acoustic impedance;
the piezoelectric substrate has a piezoelectric acoustic impedance; and
the first thin-film layer has a first thin-film acoustic impedance approximately equal to the square root of the product of the dielectric acoustic impedance and the piezoelectric acoustic impedance.

14. The device of claim 1, wherein:
the IDT is configured to generate bulk acoustic waves in the piezoelectric substrate;
the dielectric compound has a dielectric acoustic impedance;
the antireflective structure comprises a first thin-film layer having a first thin-film thickness based on a wavelength of the bulk acoustic waves; and
the first thin-film layer has a first thin-film acoustic impedance based on the dielectric acoustic impedance.

15. The device of claim 1, wherein the antireflective structure comprises:
a first thin-film layer; and
a second thin-film layer.

16. The device of claim 15, wherein:
the IDT is configured to generate longitudinal bulk acoustic waves in the piezoelectric substrate;
the first thin-film layer has a first thin-film thickness approximately equal to one-quarter of a wavelength of the longitudinal bulk acoustic waves; and
the second thin-film layer has a second thin-film thickness approximately equal to one-quarter of the wavelength of the longitudinal bulk acoustic waves.

17. The device of claim 15, wherein:
the IDT is configured to generate bulk acoustic waves in the piezoelectric substrate;
the first thin-film layer has a first thin-film thickness based on a wavelength of the bulk acoustic waves; and
the second thin-film layer has a second thin-film thickness based on the wavelength of the bulk acoustic waves.

18. The device of claim 15, wherein:
the dielectric compound has a dielectric acoustic impedance;
the first thin-film layer has a first thin-film acoustic impedance based on the dielectric acoustic impedance; and
the second thin-film layer has a second thin-film acoustic impedance based on the dielectric acoustic impedance.

19. The device of claim 15, wherein:
the IDT is configured to generate bulk acoustic waves in the piezoelectric substrate;
the first thin-film layer has a first thin-film thickness based on a wavelength of the bulk acoustic waves;
the second thin-film layer has a second thin-film thickness based on the wavelength of the bulk acoustic waves;
the dielectric compound has a dielectric acoustic impedance;
the first thin-film layer has a first thin-film acoustic impedance based on the dielectric acoustic impedance; and
the second thin-film layer has a second thin-film acoustic impedance based on the dielectric acoustic impedance.

20. The device of claim 1, further comprising a high-impedance layer on the antireflective structure.

21. The device of claim 20, further comprising the dielectric compound on the high-impedance layer, wherein:
the dielectric compound has a dielectric acoustic impedance; and
the high-impedance layer has a high-impedance acoustic impedance greater than the dielectric acoustic impedance.

22. The device of claim 21, wherein:
the IDT is configured to generate longitudinal bulk acoustic waves in the piezoelectric substrate;
the antireflective structure comprises a first thin-film layer having a first thin-film thickness approximately equal to one-quarter of a wavelength of the longitudinal bulk acoustic waves;
the piezoelectric substrate has a piezoelectric acoustic impedance; and
the first thin-film layer has a first thin-film acoustic impedance approximately equal to the square root of the product of the dielectric acoustic impedance and the piezoelectric acoustic impedance.

23. The device of claim 21, wherein:
the IDT is configured to generate bulk acoustic waves in the piezoelectric substrate;
the antireflective structure comprises a first thin-film layer having a first thin-film thickness based on a wavelength of the bulk acoustic waves; and
the first thin-film layer has a first thin-film acoustic impedance based on the dielectric acoustic impedance.

24. The device of claim 21, wherein the antireflective structure comprises:
a first thin-film layer; and
a second thin-film layer.

25. The device of claim 24, wherein:
the IDT is configured to generate bulk acoustic waves in the piezoelectric substrate;
the first thin-film layer has a first thin-film thickness based on a wavelength of the bulk acoustic waves;
the second thin-film layer has a second thin-film thickness based on the wavelength of the bulk acoustic waves;
the first thin-film layer has a first thin-film acoustic impedance based on the dielectric acoustic impedance; and
the second thin-film layer has a second thin-film acoustic impedance based on the dielectric acoustic impedance.

26. The device of claim 1, wherein:
the device is configured to receive an input signal and generate a filtered output signal based on the received input signal.

27. The device of claim 26, further comprising:
a second IDT on the front-side surface of the piezoelectric substrate, wherein the device is a surface acoustic wave (SAW) filter having a passband that has a center frequency.

28. The device of claim 1, wherein the back-side surface has a roughness average less than 20 nanometers (nm).

29. The device of claim 1, wherein:
the piezoelectric substrate comprises lithium niobate; and
a dielectric film comprising silicon oxide is on the IDT to reduce a temperature sensitivity of the device.

30. The device of claim 1, wherein:
the piezoelectric substrate is on a front-side surface of a second substrate; and
the antireflective structure is on a back-side surface of the second substrate.

31. The device of claim 30, wherein the second substrate comprises a non-piezoelectric material.

32. The device of claim 30, wherein the second substrate comprises silicon.

33. The device of claim 30, wherein the second substrate comprises quartz.

34. A method of fabricating a device comprising:
providing a piezoelectric substrate comprising:
a front-side surface; and
a smoothed back-side surface;
forming an interdigital transducer (IDT) on the front-side surface of the piezoelectric substrate;
forming an antireflective structure on at least a portion of the back-side surface of the piezoelectric substrate; and
forming a dielectric compound on the antireflective structure.

35. The method of claim 34, wherein forming the antireflective structure on the at least the portion of the back-side surface of the piezoelectric substrate comprises forming the antireflective structure the at least the portion of the back-side surface of the piezoelectric substrate before forming the dielectric compound on the antireflective structure.

36. The method of claim 34, wherein providing the piezoelectric substrate comprising the front-side surface and the back-side surface comprises:
providing the piezoelectric substrate with a smoothed back-side surface; and
backgrinding the smoothed back-side surface of the piezoelectric substrate.

37. The method of claim 36, wherein backgrinding the smoothed back-side surface of the piezoelectric substrate comprises:
backgrinding the smoothed back-side surface of the piezoelectric substrate; and
not roughening the smoothed back-side surface of the piezoelectric substrate in a subsequent step.

38. The method of claim 34, further comprising singulating the device, wherein forming the antireflective structure on the at least the portion of the back-side surface of the piezoelectric substrate comprises forming the antireflective structure on the at least the portion of the back-side surface of the piezoelectric substrate after singulating the device and before forming the dielectric compound on the antireflective structure.

39. The device of claim 1, wherein back-side surface of the piezoelectric substrate comprises a smoothed back-side surface.

* * * * *

UNITED STATES PATENT AND TRADEMARK OFFICE
CERTIFICATE OF CORRECTION

PATENT NO. : 10,924,086 B2
APPLICATION NO. : 15/785048
DATED : February 16, 2021
INVENTOR(S) : Marc Solal et al.

It is certified that error appears in the above-identified patent and that said Letters Patent is hereby corrected as shown below:

In the Specification
Column 5, Lines 27 and 28, replace "input IDT 401" with --input IDT 40I--.
Column 5, Line 28, replace both instances of "IDT 400" with --IDT 40O--.

In the Claims
Claim 34, Column 15, Line 15, replace "a smoothed back-side surface" with --a back-side surface--.
Claim 35, Column 15, Lines 25-26, replace "antireflective structure the at least the portion of the back-side surface" with --antireflective structure on the at least the portion of the back-side surface--.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*